(12) United States Patent
Senda et al.

(10) Patent No.: US 9,085,819 B2
(45) Date of Patent: Jul. 21, 2015

(54) TANTALUM SPUTTERING TARGET

(75) Inventors: Shinichiro Senda, Ibaraki (JP); Atsushi Fukushima, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 176 days.

(21) Appl. No.: 13/805,946

(22) PCT Filed: Jul. 21, 2011

(86) PCT No.: PCT/JP2011/066562
§ 371 (c)(1),
(2), (4) Date: Dec. 20, 2012

(87) PCT Pub. No.: WO2012/020631
PCT Pub. Date: Feb. 16, 2012

(65) Prior Publication Data
US 2013/0092534 A1    Apr. 18, 2013

(30) Foreign Application Priority Data
Aug. 9, 2010 (JP) ................... 2010-178654

(51) Int. Cl.
C23C 14/34 (2006.01)
C22C 1/02 (2006.01)
C22C 27/02 (2006.01)
C22F 1/18 (2006.01)

(52) U.S. Cl.
CPC ............. *C23C 14/3407* (2013.01); *C22C 1/02* (2013.01); *C22C 27/02* (2013.01); *C22F 1/18* (2013.01); *C23C 14/3414* (2013.01)

(58) Field of Classification Search
CPC .......................... H01J 37/3426; C23C 14/3414
USPC .................................... 204/298.13
See application file for complete search history.

(56) References Cited

U.S. PATENT DOCUMENTS

| 6,264,813 | B1 * | 7/2001 | Leroy et al. ............. 204/298.13 |
| 6,331,233 | B1 | 12/2001 | Turner |
| 6,348,113 | B1 | 2/2002 | Michaluk et al. |
| 6,348,139 | B1 | 2/2002 | Shah et al. |
| 6,887,356 | B2 * | 5/2005 | Ford et al. ............. 204/298.12 |
| 7,156,963 | B2 | 1/2007 | Oda |
| 7,521,132 | B2 * | 4/2009 | Kathrein et al. ............. 428/699 |
| 7,699,948 | B2 | 4/2010 | Oda et al. |
| 7,716,806 | B2 | 5/2010 | Oda |
| 7,740,717 | B2 | 6/2010 | Oda |
| 7,892,367 | B2 | 2/2011 | Oda |
| 8,172,960 | B2 | 5/2012 | Oda et al. |
| 8,177,947 | B2 | 5/2012 | Miyashita |
| 8,425,696 | B2 | 4/2013 | Oda et al. |
| 2005/0155677 | A1 | 7/2005 | Wickersham, Jr. |
| 2007/0099032 | A1 | 5/2007 | Das et al. |
| 2007/0144623 | A1 * | 6/2007 | Wickersham, Jr. ........... 148/422 |
| 2009/0134021 | A1 | 5/2009 | Oda et al. |
| 2011/0266145 | A1 | 11/2011 | Fukushima et al. |
| 2012/0031756 | A1 | 2/2012 | Fukushima et al. |
| 2012/0037501 | A1 | 2/2012 | Fukushima et al. |
| 2013/0098759 | A1 | 4/2013 | Senda et al. |
| 2014/0242401 | A1 | 8/2014 | Senda et al. |

FOREIGN PATENT DOCUMENTS

| EP | 0902102 A1 | 3/1999 |
| JP | 07054138 A * | 2/1995 |
| JP | 2002-040008 A | 2/2002 |
| JP | 2002-060934 A | 2/2002 |

OTHER PUBLICATIONS

Translation to Watanable (JP 2002-060934 cited on IDS Dec. 20, 2012) published Feb. 2002.*
Machine Translation to Kinoshita JP 07-054138 published Feb. 1995.*

* cited by examiner

*Primary Examiner* — John Brayton
(74) *Attorney, Agent, or Firm* — Howson & Howson LLP

(57) ABSTRACT

Provided is a tantalum sputtering target, in which 1 mass ppm or more and 50 mass ppm or less of boron is contained as an essential component, and of which the purity excluding boron and gas components is 99.998% or higher. Thereby obtained is a high-purity tantalum sputtering target having a uniform and fine structure and enabling plasma stabilization and achievement of superior film evenness (uniformity).

18 Claims, No Drawings

TANTALUM SPUTTERING TARGET

BACKGROUND

The present invention relates to a high-purity tantalum sputtering target having a uniform and fine structure and enabling plasma stabilization and achievement of superior film evenness (uniformity).

In recent years, the sputtering method for forming films from materials such as metal or ceramics has been used in numerous fields, which include the electronics field, the field of corrosion resistant materials and decoration, the catalytic field, as well as in the manufacture of cutting/polishing materials and abrasion-resistant materials.

While the sputtering method itself is a well-known method in the foregoing fields, particularly in the electronics field, a tantalum sputtering target suitable for forming films of complex shapes, forming circuits or forming barrier films is recently in demand.

Generally, this tantalum target is manufactured by repeating the hot forging and annealing (heat treatment) of an ingot or billet formed by performing electron beam melting and casting to a tantalum raw material, and thereafter performing rolling and finish processing (mechanical processing, polishing, etc.) thereto in order to process the ingot or billet into a target.

In this kind of production process, the hot forging performed to the ingot or billet will destroy the cast structure, disperse or eliminate the pores and segregations, and, by further performing annealing thereto, recrystallization will occur, and the densification and strength of the structure are improved.

The molten and cast ingot or billet generally has a crystal grain size of 50 mm or more. As a result of subjecting the ingot or billet to hot forging and recrystallization annealing, the cast structure is destroyed, and generally uniform and fine (100 μm or less) crystal grains can be obtained.

Meanwhile, if sputtering is to be performed using a target produced as described above, it is said that the recrystallized structure of the target becomes even finer and more uniform, more uniform deposition is possible with a target in which the crystal orientation is aligned toward a specific direction, and a film with low generation of arcing and particles and stable characteristics can be obtained.

Thus, measures are being taken, in the production process of the target, for achieving a finer and more uniform recrystallized structure and aligning the crystal orientation toward a specific direction (for example, refer to Patent Document 1 and Patent Document 2).

Moreover, disclosed is a high-purity Ta target for forming a TaN film to be used as a barrier layer against a Cu wiring film, obtained by using a high-purity Ta, in which an element having self-sustained discharge characteristics selected among Ag, Au and Cu is contained in an amount of 0.001 to 20 ppm, the total amount of Fe, Ni, Cr, Si, Al, Na, and K as impurity elements is 100 ppm or less, and the value after deduction of the content of these elements is within the range of 99.99 to 99.999% (refer to Patent Document 3).

When reviewing these Patent Documents, there is no disclosure to the effect that the inclusion of a specific element realizes a finer structure and thereby stabilizes the plasma.

In particular, Patent Document 3 describes that an element selected among Ag, Au and Cu is contained in an amount of 0.001 to 20 ppm, and the discharge amount of Ta ions increases by adding an infinitesimal amount, 0.001 ppm at minimum, of the element. However, since the additive element is contained in a trace amount, it is considered that there is a problem in that it is difficult to adjust the content and realize a uniform addition (spread).

In addition, as shown in Table 1 of Patent Document 3, the inclusion of Mo, W, Ge, and Co contents is respectively tolerated at less than 10 ppm, 20 ppm, 10 ppm, and 10 ppm. Accordingly, these impurities alone are contained in an amount less than 50 ppm.

Accordingly, as described above, Patent Document 3 describes that a high-purity Ta, in which the total amount of Fe, Ni, Cr, Si, Al, Na, and K as impurity elements is 100 ppm or less, and the value after deduction of the content of these elements is within the range of 99.99 to 99.999%, is used. However, the lower limit of the actual purity falls below (tolerates) 99.99%.

This is a level that is lower than conventional high-purity tantalum, and it is strongly assumed that the characteristics of high-purity tantalum cannot be utilized.

[Patent Document 1] Published Japanese Translation No. 2002-518593 of PCT Application

[Patent Document 2] U.S. Pat. No. 6,331,233

[Patent Document 3] Japanese Laid-Open Patent Publication No. 2002-60934

SUMMARY OF INVENTION

Technical Problem

An object of the present invention is to provide a high-purity tantalum sputtering target having a uniform and fine structure and enabling plasma stabilization and achievement of superior film evenness (uniformity) by maintaining the high purity of tantalum and adding a specific element.

Solution to Problem

In order to achieve the foregoing object, the present inventors discovered that it is possible to obtain a high-purity tantalum sputtering target having a uniform and fine structure and enabling plasma stabilization and achievement of superior film evenness (uniformity) by maintaining the high purity of tantalum and adding a specific element.

Based on the foregoing discovery, the present invention provides:

1) A tantalum sputtering target, wherein 1 mass ppm or more and 50 mass ppm or less of boron is contained as an essential component, and the purity excluding boron and gas components is 99.998% or higher;
2) A tantalum sputtering target, wherein 10 mass ppm or more and 50 mass ppm or less of boron is contained as an essential component, and the purity excluding boron and gas components is 99.998% or higher;
3) A tantalum sputtering target, wherein 10 mass ppm or more and 20 mass ppm or less of boron is contained as an essential component, and the purity excluding boron and gas components is 99.998% or higher;
4) The tantalum sputtering target according to any one of 1) to 3) above, wherein variation in the boron content in the target is ±20% or less;
5) The tantalum sputtering target according to any one of 1) to 4) above, wherein an average crystal grain size is 110 μm or less; and
6) The tantalum sputtering target according to 5) above, wherein variation in the crystal grain size is ±20% or less.

The present invention yields a superior effect of being able to provide a high-purity tantalum sputtering target having a uniform and fine structure and enabling plasma stabilization and achievement of superior film evenness (uniformity) by maintaining the high purity of tantalum and adding boron as an essential component. Moreover, since the plasma stabilization during sputtering can also be realized during the initial stage of sputtering, the present invention additionally yields the effect of being able to shorten the burn-in time.

DETAILED DESCRIPTION

High-purity tantalum is used as the raw material of the tantalum (Ta) target in the present invention. An example of this high-purity tantalum is shown in Table 1 (refer to the journal of technical disclosure 2005-502770 entitled "High-purity Tantalum and Sputtering Target composed of High-purity Tantalum" edited by the Japan Institute of Invention and Innovation).

In Table 1, the amount of all impurities excluding gas components is less than 1 wtppm; that is, 99.999 to 99.9999 wt %, and this kind of high-purity tantalum can be used.

TABLE 1

| Element | Concentration [ppm wt] |
|---|---|
| Li | <0.001 |
| Be | <0.001 |
| B | <0.005 |
| F | <0.05 |
| Na | <0.005 |
| Mg | <0.005 |
| Al | <0.005 |
| Si | <0.001 |
| P | <0.005 |
| S | <0.005 |
| Cl | <0.01 |
| K | <0.01 |
| Ca | <0.01 |
| Sc | <0.001 |
| Ti | <0.001 |
| V | <0.001 |
| Cr | <0.001 |
| Mn | <0.001 |
| Fe | <0.005 |
| Co | <0.001 |
| Ni | <0.005 |
| Cu | <0.01-0.20 |
| Zn | <0.01 |
| Ga | <0.01 |
| Ge | <0.01 |
| As | <0.005 |
| Se | <0.01 |
| Br | <0.01 |
| Rb | <0.005 |
| Sr | <0.005 |
| Y | <0.001 |
| Zr | <0.01 |
| Nb | 0.1-0.46 |
| Mo | 0.05-0.20 |
| Ru | <0.01 |
| Rh | <0.005 |
| Pd | <0.005 |
| Ag | <0.005 |
| Cd | <0.01 |
| In | <0.005 |
| Sn | <0.05 |
| Sb | <0.01 |
| Te | <0.01 |
| I | <0.01 |
| Cs | <0.005 |
| Ba | <0.005 |
| La | <0.005 |
| Ce | <0.005 |
| Pr | <0.005 |
| Nd | <0.005 |
| Sm | <0.005 |
| Eu | <0.005 |
| Gd | <0.005 |
| Tb | <0.005 |
| Dy | <0.005 |
| Ho | <0.005 |
| Er | <0.005 |
| Tm | <0.005 |
| Yb | <0.005 |
| Lu | <0.005 |
| Hf | <0.01 |
| Ta | Matrix |
| W | <0.05-0.27 |
| Re | <0.01 |
| Os | <0.005 |
| Ir | <0.01 |
| Pt | <0.05 |
| Au | <0.1 |
| Hg | <0.05 |
| Tl | <0.005 |
| Pb | <0.005 |
| Bi | <0.005 |
| Th | <0.0001 |
| U | <0.0001 |

The sputtering target of the present invention is ordinarily produced with the following process.

To exemplify a specific example, tantalum, for instance, high-purity tantalum of 4N (99.99% or higher), is used, and appropriate amount of boron (B) is added thereto to prepare a target raw material. The purity thereof is increased by melting and refining the target raw material via electron beam melting or the like, and this is cast to prepare an ingot or a billet. Needless to say, the high-purity tantalum of 99.999 to 99.9999 wt % shown in Table 1 may be used as substitute for the above.

Subsequently, this ingot or billet is subject to a series of processing steps including annealing-forging, rolling, annealing (heat treatment), finish processing and the like.

Specifically, for instance, a target material is obtained by subjecting the foregoing ingot to: extend forging—(first) annealing at a temperature between 1373 K and 1673 K—(first) cold forging—(second) recrystallization annealing at a temperature between the recrystallization start temperature and 1673 K—(second) cold forging—(third) recrystallization annealing at a temperature between the recrystallization start temperature and 1673 K—(first) cold (hot) rolling—(fourth) recrystallization annealing at a temperature between the recrystallization start temperature and 1373 K—(as needed, second) cold (hot) rolling—(as needed, fifth) recrystallization annealing at a temperature between the recrystallization start temperature and 1373 K—finish processing.

The forging or rolling performed to the ingot or billet will destroy the cast structure, disperse or eliminate the pores and segregations. By further performing annealing thereto, recrystallization will occur, and the densification, refinement and strength of the structure can be improved by repeating the cold forging or cold rolling and the recrystallization annealing. While the recrystallization annealing may only be performed once in the foregoing working process, the structural defects can be reduced as much as possible by repeating such recrystallization annealing twice. Moreover, the cold (hot) rolling and recrystallization annealing at a temperature between the recrystallization start temperature and 1373 K may be repeated or may be performed only for one cycle. The final target shape is obtained by subsequently performing finish processing such as machining and polishing.

The tantalum target is ordinarily produced based on the foregoing production process, but this production method is merely an exemplification. Moreover, since the present invention is not an invention of the production process, the target can also be produced based on other processes as a matter of course, and this invention covers all of these targets.

A material having a purity level of 6N is often used to leverage the characteristics of the tantalum target, but there was always a problem in that the crystal grains of the target would easily become coarse.

The present inventors discovered that, in the production of such a 6N-level target, the crystal grain size was locally fine at the portion where boron, of which content is approximately 0.5 mass ppm under normal circumstances, had segregated incidentally at approximately 1 mass ppm. Accordingly, as a result of obtaining the hint that the addition of boron may be effective for achieving a finer tantalum target, the present inventors found the opportunity that led to this invention.

Specifically, what is important with the tantalum sputtering target of this invention is that boron is contained as an essential component at 1 mass ppm or more and 50 mass ppm or less in tantalum having a purity of 99.998% or higher excluding boron and gas components. 1 mass ppm as the lower limit of boron is a numerical value for exhibiting the foregoing effect, and 50 mass ppm as the upper limit of boron is the upper limit for maintaining the effect of the present invention. If the boron content exceeds this upper limit, segregation of boron will occur, recrystallization of boron will be partially incomplete, and the burn-in time will consequently be prolonged. Thus, 50 mass ppm set as the upper limit of boron.

The inclusion of tantalum forms a uniform and fine structure of the target, thereby stabilizes the plasma, and improves the evenness (uniformity) of the sputtered film. Moreover, since the plasma stabilization during sputtering can also be realized during the initial stage of sputtering, the burn-in time can be shortened.

In the foregoing case, tantalum needs to be of high purity; that is, 99.998% or higher. Here, gas components with a small atomic radius such as oxygen, hydrogen, carbon, and nitrogen can be excluded. Generally speaking, it is difficult to eliminate gas components unless a special method is employed, and difficult to eliminate these during the refining in the standard production process. Thus, gas components are excluded from the purity of tantalum of the present invention.

As described above, boron realizes the uniform and fine structure of tantalum, but the inclusion of other metal components, non-metal components having metallic nature (metalloids), oxides, nitrides, carbides and other ceramics is harmful and cannot be tolerated. This is because these impurity elements are considered to inhibit the effect of boron. In addition, unlike in the case of boron, it is difficult to achieve a uniform crystal grain size of the tantalum target, and these impurities do not contribute to the stabilization of the sputtering characteristics.

Preferably, the tantalum sputtering target of the present invention contains 10 mass ppm or more and 50 mass ppm or less of boron as an essential component, and has a purity of 99.998% or higher excluding boron and gas components.

Further preferably, the tantalum sputtering target of the present invention contains 10 mass ppm or more and 20 mass ppm or less of boron as an essential component, and has a purity of 99.998% or higher excluding boron and gas components.

With the tantalum sputtering target of the present invention, preferably, variation in the boron content in the target is ±20% or less.

So as long as the inclusion of an appropriate amount of boron yields the function (property) of forming the uniform and fine structure of the tantalum sputtering target, the uniform dispersion of boron will contribute even more to the uniform and fine structure of the target.

Needless to say, it is easy to achieve the above with a standard production process, but it is necessary to take note of causing the variation in the boron content in the target to be ±20% or less, and to have a clear intent to achieve the same.

The variation in the boron content in the target is measured; for example, in the case of a discoid target, by taking three points (center point, ½ point of the radius, and point in the outer periphery or its vicinity) on eight equal lines drawn from the center of the disk, and analyzing the boron content at a total of 17 points {16 points+center point (since the center point is common, it is counted as one point)}.

Subsequently, the variation is calculated at the respective points based on the formula of {(maximum value−minimum value)/(maximum value+minimum value)}×100.

With the tantalum sputtering target of the present invention, more preferably, the average crystal grain size is 100 μm or less. The crystal grain size can be refined by the addition of an appropriate amount of boron and a normal production process, but it is necessary to take note of causing the average crystal grain size to be 100 μm or less, and to have a clear intent to achieve the same.

More preferably, the variation in the crystal grain size is ±20% or less.

The variation in the average crystal grain size of the boron is measured; for example, in the case of a discoid target, by taking three points (center point, ½ point of the radius, and point in the outer periphery or its vicinity) on eight equal lines drawn from the center of the disk, and measuring the crystal grain size of boronate at a total of 17 points {16 points+center point (since the center point is common, it is counted as one point)}.

Subsequently, the variation in the crystal grain size is calculated at the respective points based on the formula of {(maximum value−minimum value)/(maximum value+minimum value)}×100.

This kind of target structure enables plasma stabilization and achievement of superior evenness (uniformity) of the film. Moreover, since the plasma stabilization during sputtering can also be realized during the initial stage of sputtering, the present invention additionally yields the effect of being able to shorten the burn-in time.

EXAMPLES

The present invention is now explained in detail with reference to the Examples. These Examples are merely illustrative, and the present invention shall in no way be limited thereby. In other words, the present invention covers the other modes and modifications included in the technical concept of this invention.

Example 1

A raw material obtained by adding boron in an amount corresponding to 1 mass ppm to tantalum having a purity of 99.998% was subject to electron beam melting, and this was cast to prepare an ingot having a thickness of 200 mm and a diameter of 200 mmφ. The crystal grain size in this case was approximately 55 mm.

After performing extend forging to this ingot or billet at room temperature, this was subject to recrystallization annealing at a temperature of 1500 K. As a result, a material having a thickness of 120 mm, a diameter of 130 mmφ, and a structure in which the average crystal grain size is 200 μm was obtained.

This material was subject to extend forging and upset forging at room temperature once again, and recrystallization annealing was performed thereto again at a temperature of 1480 K. As a result of repeating forging and heat treatment once again, a material having a thickness of 120 mm, a diameter of 130 mmφ, and a structure in which the average crystal grain size is 100 μm was obtained.

Subsequently, this was subject to cold rolling and recrystallization annealing at a temperature of 1173 K, and further subject to finish processing so as to obtain a target material having a thickness of 10 mm and a diameter of 450 mmφ. The halfway and last cold working and recrystallization annealing were adjusted to achieve the following average crystal grain size and variation in the crystal grain size. While the average crystal grain size and variation will also change depending on the additive amount of boron, the foregoing adjustment was possible in this Example.

The average crystal grain size of the target was 90 μm, and the variation in the crystal grain size was ±20%. Moreover, the variation in the boron content was ±19%. The results are shown in Table 2.

Since the sheet resistance depends on the film thickness, the distribution of the sheet resistance in the wafer (12 inches) was measured to confirm the distribution condition of the film thickness. Specifically, the sheet resistance was measured at 49 points on the wafer to calculate the standard deviation (σ) thereof.

The results are shown in Table 2. As evident from Table 2, the fluctuation of the resistance distribution in the sheet is small (2.5 to 3.8%) from the initial stage to the end stage of sputtering in this Example; that is, the fluctuation of the film thickness distribution is small.

The electrical energy required until the initial stabilization of sputtering was also measured and showed 120 kWh, and the required electrical energy decreased considerably in comparison to the Comparative Examples described later. The results are also shown in Table 2. Accordingly, in addition to being able to reduce the electrical energy required until the initial stabilization (being able to shorten the burn-in time), the evenness (uniformity) of the film was favorable, and it was possible to improve the quality of the sputter deposition.

having a thickness of 120 mm, a diameter of 130 mmφ, and a structure in which the average crystal grain size is 200 μm was obtained.

This material was subject to extend forging and upset forging at room temperature once again, and recrystallization annealing was performed thereto again at a temperature of 1400 to 1500 K. As a result of repeating forging and heat treatment once again, a material having a thickness of 120 mm, a diameter of 130 mmφ, and a structure in which the average crystal grain size is 100 μm was obtained.

Subsequently, this was subject to cold rolling and recrystallization annealing at a temperature of 1173 K, and further subject to finish processing so as to obtain a target material having a thickness of 10 mm and a diameter of 450 mmφ. The halfway and last cold working and recrystallization annealing were adjusted to achieve the following average crystal grain size and variation in the crystal grain size. While the average crystal grain size and variation will also change depending on the additive amount of boron, the foregoing adjustment was possible in this Example.

The average crystal grain size of the target was 70 μm, and the variation in the crystal grain size was ±16%. Moreover, the variation in the boron content was ±16%. The results are shown in Table 2.

Since the sheet resistance depends on the film thickness, the distribution of the sheet resistance in the wafer (12 inches) was measured to confirm the distribution condition of the film thickness. Specifically, the sheet resistance was measured at 49 points on the wafer to calculate the standard deviation (σ) thereof.

The results are shown in Table 2. As evident from Table 2, the fluctuation of the resistance distribution in the sheet is small (2.4 to 3.5%) from the initial stage to the end stage of sputtering in this Example; that is, the fluctuation of the film thickness distribution is small.

The electrical energy required until the initial stabilization of sputtering was also measured and showed 80 kWh, and the required electrical energy decreased. The results are also shown in Table 2. Accordingly, in addition to being able to

TABLE 2

| | B (massppm) | Variation in B content | Average crystal grain size (μm) | Variation in crystal grain size | Distribution of sheet resistance | Electrical energy required until initial stabilization | Film uniformity |
|---|---|---|---|---|---|---|---|
| Example 1 | 1 | ±19% | 90 | ±20% | 2.5~3.8% | 120 kwh | Favorable |
| Example 2 | 5 | ±16% | 70 | ±16% | 2.4~3.5% | 80 kwh | Favorable |
| Example 3 | 10 | ±15% | 50 | ±17% | 2.2~3.0% | 50 kwh | Favorable |
| Example 4 | 20 | ±13% | 35 | ±15% | 1.6~2.2% | 45 kwh | Favorable |
| Example 5 | 50 | ±9% | 20 | ±7% | 2.0~3.1% | 60 kwh | Favorable |
| Comprative Example 1 | 0.5 | ±30% | 120 | ±30% | 3.9~5.0% | 200 kwh | Inferior |
| Cornprative Example 2 | 100 | ±65% | 10 Unrecrystallized | ±50% | 5.0~7.0% | 300 kwh | Inferior |

Example 2

A raw material obtained by adding boron in an amount corresponding to 5 mass ppm to tantalum having a purity of 99.998% was subject to electron beam melting, and this was cast to prepare an ingot having a thickness of 200 mm and a diameter of 200 mmφ. The crystal grain size in this case was approximately 50 mm.

After performing extend forging to this ingot or billet at room temperature, this was subject to recrystallization annealing at a temperature of 1500 K. As a result, a material shorten the burn-in time, the evenness (uniformity) of the film was favorable, and it was possible to improve the quality of the sputter deposition.

Example 3

A raw material obtained by adding boron in an amount corresponding to 10 mass ppm to tantalum having a purity of 99.998% was subject to electron beam melting, and this was cast to prepare an ingot having a thickness of 200 mm and a diameter of 200 mmϕ. The crystal grain size in this case was approximately 45 mm.

After performing extend forging to this ingot or billet at room temperature, this was subject to recrystallization annealing at a temperature of 1500 K. As a result, a material having a thickness of 120 mm, a diameter of 130 mmϕ, and a structure in which the average crystal grain size is 200 μm was obtained.

This material was subject to extend forging and upset forging at room temperature once again, and recrystallization annealing was performed thereto again at a temperature of 1400 to 1500 K. As a result of repeating forging and heat treatment once again, a material having a thickness of 120 mm, a diameter of 130 mmϕ, and a structure in which the average crystal grain size is 100 μm was obtained.

Subsequently, this was subject to cold rolling and recrystallization annealing at a temperature of 1173 K, and further subject to finish processing so as to obtain a target material having a thickness of 10 mm and a diameter of 450 mmϕ. The halfway and last cold working and recrystallization annealing were adjusted to achieve the following average crystal grain size and variation in the crystal grain size. While the average crystal grain size and variation will also change depending on the additive amount of boron, the foregoing adjustment was possible in this Example.

The average crystal grain size of the target was 50 μm, and the variation in the crystal grain size was ±17%. Moreover, the variation in the boron content was ±15%. The results are shown in Table 2.

Since the sheet resistance depends on the film thickness, the distribution of the sheet resistance in the wafer (12 inches) was measured to confirm the distribution condition of the film thickness. Specifically, the sheet resistance was measured at 49 points on the wafer to calculate the standard deviation (σ) thereof.

The results are shown in Table 2. As evident from Table 2, the fluctuation of the resistance distribution in the sheet is small (2.2 to 3.0%) from the initial stage to the end stage of sputtering in this Example; that is, the fluctuation of the film thickness distribution is small.

The electrical energy required until the initial stabilization of sputtering was also measured and showed 50 kWh, and the required electrical energy decreased. The results are also shown in Table 2. Accordingly, in addition to being able to shorten the burn-in time, the evenness (uniformity) of the film was favorable, and it was possible to improve the quality of the sputter deposition.

Example 4

A raw material obtained by adding boron in an amount corresponding to 20 mass ppm to tantalum having a purity of 99.998% was subject to electron beam melting, and this was cast to prepare an ingot having a thickness of 200 mm and a diameter of 200 mmϕ. The crystal grain size in this case was approximately 40 mm.

After performing extend forging to this ingot or billet at room temperature, this was subject to recrystallization annealing at a temperature of 1500 K. As a result, a material having a thickness of 120 mm, a diameter of 130 mmϕ, and a structure in which the average crystal grain size is 200 μm was obtained.

This material was subject to extend forging and upset forging at room temperature once again, and recrystallization annealing was performed thereto again at a temperature of 1400 to 1500 K. As a result of repeating forging and heat treatment once again, a material having a thickness of 120 mm, a diameter of 130 mmϕ, and a structure in which the average crystal grain size is 90 μm was obtained.

Subsequently, this was subject to cold rolling and recrystallization annealing at a temperature of 1173 K, and further subject to finish processing so as to obtain a target material having a thickness of 10 mm and a diameter of 450 mmϕ. The halfway and last cold working and recrystallization annealing were adjusted to achieve the following average crystal grain size and variation in the crystal grain size. While the average crystal grain size and variation will also change depending on the additive amount of boron, the foregoing adjustment was possible in this Example.

The average crystal grain size of the target was 35 μm, and the variation in the crystal grain size was ±15%. Moreover, the variation in the boron content was ±13%. The results are shown in Table 2.

Since the sheet resistance depends on the film thickness, the distribution of the sheet resistance in the wafer (12 inches) was measured to confirm the distribution condition of the film thickness. Specifically, the sheet resistance was measured at 49 points on the wafer to calculate the standard deviation (σ) thereof.

The results are shown in Table 2. As evident from Table 2, the fluctuation of the resistance distribution in the sheet is small (1.6 to 2.2%) from the initial stage to the end stage of sputtering in this Example; that is, the fluctuation of the film thickness distribution is small.

The electrical energy required until the initial stabilization of sputtering was also measured and showed 45 kWh, and the required electrical energy decreased. The results are also shown in Table 2. Accordingly, in addition to being able to shorten the burn-in time, the evenness (uniformity) of the film was favorable, and it was possible to improve the quality of the sputter deposition.

Example 5

A raw material obtained by adding boron in an amount corresponding to 50 mass ppm to tantalum having a purity of 99.999% was subject to electron beam melting, and this was cast to prepare an ingot having a thickness of 200 mm and a diameter of 200 mmϕ. The crystal grain size in this case was approximately 35 mm.

After performing extend forging to this ingot or billet at room temperature, this was subject to recrystallization annealing at a temperature of 1500 K. As a result, a material having a thickness of 120 mm, a diameter of 130 mmϕ, and a structure in which the average crystal grain size is 200 μm was obtained.

This material was subject to extend forging and upset forging at room temperature once again, and recrystallization annealing was performed thereto again at a temperature of 1400 to 1500 K. As a result of repeating forging and heat treatment once again, a material having a thickness of 120 mm, a diameter of 130 mmϕ, and a structure in which the average crystal grain size is 80 μm was obtained.

Subsequently, this was subject to cold rolling and recrystallization annealing at a temperature of 1173 K, and further subject to finish processing so as to obtain a target material having a thickness of 10 mm and a diameter of 450 mmϕ. The halfway and last cold working and recrystallization annealing were adjusted to achieve the following average crystal grain size and variation in the crystal grain size. While the average crystal grain size and variation will also change depending on the additive amount of boron, the foregoing adjustment was possible in this Example.

The average crystal grain size of the target was 20 μm, and the variation in the crystal grain size was ±7%. Moreover, the variation in the boron content was ±9%. The results are shown in Table 2.

Since the sheet resistance depends on the film thickness, the distribution of the sheet resistance in the wafer (12 inches) was measured to confirm the distribution condition of the film thickness. Specifically, the sheet resistance was measured at 49 points on the wafer to calculate the standard deviation (σ) thereof.

The results are shown in Table 2. As evident from Table 2, the fluctuation of the resistance distribution in the sheet is small (2.0 to 3.1%) from the initial stage to the end stage of sputtering in this Example; that is, the fluctuation of the film thickness distribution is small.

The electrical energy required until the initial stabilization of sputtering was also measured and showed 60 kWh, and the required electrical energy decreased. The results are also shown in Table 2. Accordingly, in addition to being able to shorten the burn-in time, the evenness (uniformity) of the film was favorable, and it was possible to improve the quality of the sputter deposition.

Comparative Example 1

A raw material obtained by adding boron in an amount corresponding to 0.5 mass ppm to tantalum having a purity of 99.995% was subject to electron beam melting, and this was cast to prepare an ingot having a thickness of 200 mm and a diameter of 200 mmφ. The crystal grain size in this case was approximately 60 mm.

After performing extend forging to this ingot or billet at room temperature, this was subject to recrystallization annealing at a temperature of 1500 K. As a result, a material having a thickness of 120 mm, a diameter of 130 mmφ, and a structure in which the average crystal grain size is 200 μm was obtained.

This material was subject to extend forging and upset forging at room temperature once again, and recrystallization annealing was performed thereto again at a temperature of 1400 to 1500 K. As a result of repeating forging and heat treatment once again, a material having a thickness of 120 mm, a diameter of 130 mmφ, and a structure in which the average crystal grain size is 150 μm was obtained.

Subsequently, this was subject to cold rolling and recrystallization annealing at a temperature of 1173 K, and further subject to finish processing so as to obtain a target material having a thickness of 10 mm and a diameter of 450 mmφ. The halfway and last cold working and recrystallization annealing were adjusted to achieve an appropriate average crystal grain size and variation in the crystal grain size, but the foregoing adjustment was not possible in this Comparative Example, and resulted in that the average crystal grain size of the target was 120 μm and variation in the crystal grain size was ±30%. In addition, variation in the boron content was ±30%. The results are similarly shown in Table 2.

Since the sheet resistance depends on the film thickness, the distribution of the sheet resistance in the wafer (12 inches) was measured to confirm the distribution condition of the film thickness. Specifically, the sheet resistance was measured at 49 points on the wafer to calculate the standard deviation (σ) thereof.

The results are similarly shown in Table 2. As evident from Table 2, the fluctuation of the resistance distribution in the sheet is large (3.9 to 5.0%) from the initial stage to the end stage of sputtering in this Comparative Example; that is, the fluctuation of the film thickness distribution is large.

The electrical energy required until the initial stabilization of sputtering was also measured and showed 200 kWh, and the required electrical energy increased. The results are also shown in Table 2. Accordingly, it was not possible to shorten the burn-in time, the evenness (uniformity) of the film was inferior, and it was not possible to improve the quality of the sputter deposition.

Similar testing was performed for a case of adding boron in an amount of 0.5 mass ppm to tantalum having a purity of 99.999%, but the same tendency as this Comparative Example 1 was observed. It was obvious that this also affected the tendency regardless of the purity of tantalum.

Comparative Example 2

A raw material obtained by adding boron in an amount corresponding to 100 mass ppm to tantalum having a purity of 99.999% was subject to electron beam melting, and this was cast to prepare an ingot having a thickness of 200 mm and a diameter of 200 mmφ. The crystal grain size in this case was approximately 20 mm.

After performing extend forging to this ingot or billet at room temperature, this was subject to recrystallization annealing at a temperature of 1500 K. As a result, a material having a thickness of 120 mm, a diameter of 130 mmφ, and a structure in which the average crystal grain size is 200 μm was obtained.

This material was subject to extend forging and upset forging at room temperature once again, and recrystallization annealing was performed thereto again at a temperature of 1400 to 1500 K. As a result of repeating forging and heat treatment once again, a material having a thickness of 120 mm, a diameter of 130 mmφ, and a structure in which the average crystal grain size is 70 μm was obtained.

Subsequently, this was subject to cold rolling and recrystallization annealing at a temperature of 1173 K, and further subject to finish processing so as to obtain a target material having a thickness of 10 mm and a diameter of 450 mmφ. The halfway and last cold working and recrystallization annealing were adjusted to achieve an appropriate average crystal grain size and variation in the crystal grain size, but the foregoing adjustment was not possible in this Comparative Example, and resulted in that, while the average crystal grain size of the target was 10 μm, unrecrystallized grains existed, and therefore variation in the crystal grain size was large at ±50%. In addition, variation in the boron content was ±65%. The results are similarly shown in Table 2.

Since the sheet resistance depends on the film thickness, the distribution of the sheet resistance in the wafer (12 inches) was measured to confirm the distribution condition of the film thickness. Specifically, the sheet resistance was measured at 49 points on the wafer to calculate the standard deviation (σ) thereof.

The results are similarly shown in Table 2. As evident from Table 2, the fluctuation of the resistance distribution in the sheet is large (5.0 to 7.0%) from the initial stage to the end stage of sputtering in this Comparative Example; that is, the fluctuation of the film thickness distribution is large.

The electrical energy required until the initial stabilization of sputtering was also measured and showed 300 kWh, and the required electrical energy increased. The results are also shown in Table 2. Accordingly, it was not possible to shorten the burn-in time, the evenness (uniformity) of the film was inferior, and it was not possible to improve the quality of the sputter deposition.

When the amount of boron added to tantalum having a purity of 99.999% exceeded 100 mass ppm, the crystal grain size coarsened and the variation increased rapidly, and variation in the boron content became prominent.

This is considered to be a result of the segregation of boron, and it was discovered that the addition of excessive boron is undesirable.

The present invention yields a superior effect of being able to provide a high-purity tantalum sputtering target having a uniform and fine structure and enabling plasma stabilization and achievement of superior film evenness (uniformity) by containing 1 mass ppm or more and 50 mass ppm or less of boron as an essential component, and by having a purity of 99.998% or higher excluding boron and gas components. Moreover, since the plasma stabilization during sputtering can also be realized during the initial stage of sputtering, the present invention additionally yields the effect of being able to shorten the burn-in time. Thus, the target of the present invention is useful in the electronics field, particularly as a target suitable for forming films of complex shapes, forming circuits or forming barrier films.

The invention claimed is:

1. A tantalum sputtering target, consisting of 1 mass ppm or more and 50 mass ppm or less of boron and tantalum of a purity, excluding boron and gas components, of 99.998% or higher.

2. A tantalum sputtering target, consisting of 10 mass ppm or more and 50 mass ppm or less of boron and tantalum of a purity, excluding boron and gas components, of 99.998% or higher.

3. A tantalum sputtering target, consisting of 10 mass ppm or more and 20 mass ppm or less of boron and tantalum of a purity, excluding boron and gas components, of 99.998% or higher.

4. The tantalum sputtering target according to claim 3, wherein variation in the boron content in the target is ±20% or less.

5. The tantalum sputtering target according to claim 4, wherein an average crystal grain size is 110 μm or less.

6. The tantalum sputtering target according to claim 5, wherein variation in the crystal grain size is ±20% or less.

7. The tantalum sputtering target according to claim 3, wherein an average crystal grain size is 110 μm or less.

8. The tantalum sputtering target according to claim 7, wherein variation in the crystal grain size is ±20% or less.

9. The tantalum sputtering target according to claim 2, wherein variation in the boron content in the target is ±20% or less.

10. The tantalum sputtering target according to claim 9, wherein an average crystal grain size is 110 μm or less.

11. The tantalum sputtering target according to claim 10, wherein variation in the crystal grain size is ±20% or less.

12. The tantalum sputtering target according to claim 2, wherein an average crystal grain size is 110 μm or less.

13. The tantalum sputtering target according to claim 12, wherein variation in the crystal grain size is ±20% or less.

14. The tantalum sputtering target according to claim 1, wherein variation in the boron content in the target is ±20% or less.

15. The tantalum sputtering target according to claim 14, wherein an average crystal grain size is 110 μm or less.

16. The tantalum sputtering target according to claim 15, wherein variation in the crystal grain size is ±20% or less.

17. The tantalum sputtering target according to claim 1, wherein an average crystal grain size is 110 μm or less.

18. The tantalum sputtering target according to claim 17, wherein variation in the crystal grain size is ±20% or less.

* * * * *